US008749960B2

(12) United States Patent
Mori

(10) Patent No.: US 8,749,960 B2
(45) Date of Patent: Jun. 10, 2014

(54) ELECTRONIC DEVICE ACCESSORY AND METHOD OF PROVIDING AND USING THE SAME

(75) Inventor: Kenneth Mori, Los Angeles, AZ (US)

(73) Assignee: Belkin International, Inc., Playa Vista, CA (US)

( * ) Notice: Subject to any disclaimer, the term of this patent is extended or adjusted under 35 U.S.C. 154(b) by 211 days.

(21) Appl. No.: 13/216,158

(22) Filed: Aug. 23, 2011

(65) Prior Publication Data

US 2012/0044622 A1    Feb. 23, 2012

Related U.S. Application Data

(60) Provisional application No. 61/376,255, filed on Aug. 23, 2010, provisional application No. 61/394,314, filed on Oct. 18, 2010.

(51) Int. Cl.
*G06F 1/16* (2006.01)

(52) U.S. Cl.
USPC ............ 361/679.03; 361/679.55; 361/679.56; 361/679.41; 710/303; 710/304; 248/346.03

(58) Field of Classification Search
USPC .................................................. 361/679.41
See application file for complete search history.

(56) References Cited

U.S. PATENT DOCUMENTS

| | | | | |
|---|---|---|---|---|
| 5,105,338 A * | 4/1992 | Held | ......................... | 361/679.09 |
| 5,396,399 A * | 3/1995 | Blair et al. | ............... | 361/679.26 |
| 5,445,266 A * | 8/1995 | Prete et al. | .................... | 206/320 |
| 5,555,157 A * | 9/1996 | Moller et al. | .............. | 361/679.3 |
| 6,301,098 B1 * | 10/2001 | Kim | ......................... | 361/679.55 |
| 6,538,642 B2 * | 3/2003 | Tsai | .............................. | 345/168 |
| 6,700,775 B1 * | 3/2004 | Chuang et al. | ........... | 361/679.01 |
| 6,882,524 B2 | 4/2005 | Ulla et al. | | |
| 6,967,836 B2 * | 11/2005 | Huang et al. | ............. | 361/679.46 |
| 6,986,492 B2 * | 1/2006 | Huang et al. | ............. | 248/346.03 |
| 7,327,560 B1 * | 2/2008 | Tabasso et al. | .......... | 361/679.09 |
| 7,567,432 B1 | 7/2009 | Tabasso et al. | | |
| 7,952,866 B2 * | 5/2011 | Lee et al. | .................. | 361/679.55 |
| 8,173,893 B2 * | 5/2012 | Huang | .......................... | 136/251 |
| 8,328,008 B2 * | 12/2012 | Diebel et al. | ............... | 206/45.24 |
| 2004/0159762 A1 * | 8/2004 | Ghosh | .......................... | 248/351 |
| 2005/0139740 A1 * | 6/2005 | Chen et al. | .................. | 248/286.1 |
| 2006/0007645 A1 * | 1/2006 | Chen et al. | ..................... | 361/681 |

OTHER PUBLICATIONS

Ifrogz, ZAGG iPad 2 Cases Summit, © ZAGG, Inc. 2005-2011, http://www.zagg.com/ifrogz/ipad-2-cases/summit, Nov. 15, 2011, pp. 1-2.

* cited by examiner

*Primary Examiner* — Anthony Q Edwards
(74) *Attorney, Agent, or Firm* — Bryan Cave LLP

(57) ABSTRACT

Some embodiments include an electronic device accessory. Other embodiments of related electronic device accessories and methods of providing and using the same are disclosed.

29 Claims, 10 Drawing Sheets

ELECTRONIC DEVICE ACCESSORY AND METHOD OF PROVIDING AND USING THE SAME

CROSS-REFERENCE TO RELATED APPLICATIONS

This application claims the benefit of U.S. Provisional Application No. 61/376,255 filed Aug. 23, 2010, and U.S. Provisional Application No. 61/394,314 filed Oct. 18, 2010, each of the disclosures for which is incorporated by reference herein.

FIELD OF THE INVENTION

This invention relates generally to electrical device accessories, and relates more particularly to electronic devices accessories providing protection to electronic devices while also facilitating external control of the electronic devices and methods of providing and using the same.

DESCRIPTION OF THE BACKGROUND

Although streamlining electronic devices for mobility can provide certain advantages to users, these electronic devices are frequently delicate, creating a risk of damage to the electronic devices. Meanwhile, integrated control mechanisms for these electronic devices, while convenient when using the electronic devices on the go, often have far diminished utility for stationary use.

Accordingly, a need or potential for benefit exists for an electronic device accessory providing protection to an electronic device while also facilitating external control of the electronic device.

BRIEF DESCRIPTION OF THE DRAWINGS

To facilitate further description of the embodiments, the following drawings are provided in which.

Figure 1:
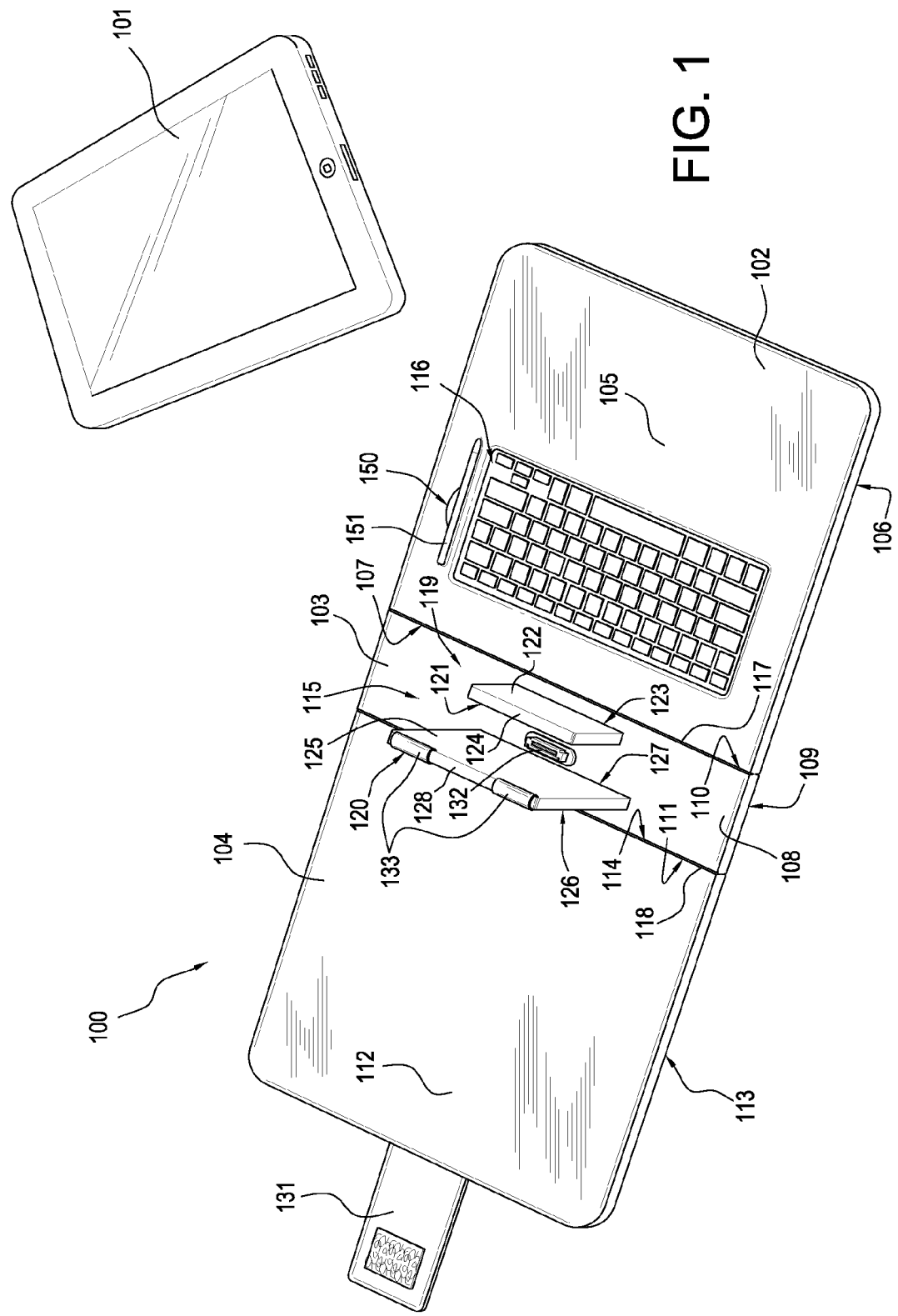
FIG. 1 illustrates a left front isometric view of an exemplary electronic device accessory for an electronic device, according to an embodiment, where the exemplary electronic device accessory is in a first open configuration.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled together, but not be mechanically or otherwise coupled together; two or more mechanical elements may be mechanically coupled together, but not be electrically or otherwise coupled together; two or more electrical elements may be mechanically coupled together, but not be electrically or otherwise coupled together. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

The term "mobile electronic device" as used herein refers to at least one of a digital music player, a digital video player, a digital music and video player, a cellular telephone (e.g., smart telephone), a personal digital assistant, a handheld digital computer (e.g., a calculator, a tablet personal computer, a netbook computer, a portable gaming console), or another suitable device configured to output audio and/or visual data. For example, a mobile electronic device can comprise the iPod®, iPhone®, iTouch®, or iPad® product by Apple Inc. of Cupertino, Calif. Likewise, a mobile electronic device can comprise a Blackberry® product by Research in Motion (RIM) of Waterloo, Ontario, Canada, or a different product by a different manufacturer.

The term "wireless network" is defined as a collection of computers and/or devices interconnected by communications channels that facilitate communications among users and allows users to share resources (e.g., an internet connection, an Ethernet connection, etc.). The computers and devices can be interconnected according to any conventional network topology (e.g., bus, star, tree, linear, ring, mesh, etc.).

DETAILED DESCRIPTION OF EXAMPLES OF EMBODIMENTS

Some embodiments include a case for an electronic device. The case comprises a first panel comprising a first panel inner side, a first panel outer side, and a first panel connection side. Likewise, the case comprises a second panel comprising a second panel inner side, a second panel outer side, a first second panel connection side, and a second second panel connection side. The case also comprises a third panel comprising a third panel inner side, a third panel outer side, and a third panel connection side. Additionally, the case comprises a cradle coupled to the second panel inner side, the cradle being configured to receive the electronic device. The first panel inner side can comprise at least one control mechanism configured to communicate with and operate the electronic device. The first panel connection side can be coupled to the first second panel connection side forming a first axis of rotation, and the third panel connection side can be coupled to the second second panel connection side forming a second axis of rotation.

Various embodiments include a method of providing a case for an electronic device. The method can comprise: providing a first panel comprising a first panel inner side, a first panel outer side, and a first panel connection side; providing a second panel comprising a second panel inner side, a second panel outer side, a first second panel connection side, and a second second panel connection side; providing a third panel comprising a third panel inner side, a third panel outer side, and a third panel connection side; providing a cradle configured to receive the electronic device; providing at least one control mechanism configured to communicate with and operate the electronic device; coupling the cradle to the second panel inner side; coupling the at least one control mechanism to the first panel inner side; coupling the first panel connection side to the first second panel connection side to form a first axis of rotation; and coupling the third panel connection side to the second second panel connection side to form a second axis of rotation.

Further embodiments include a method of using a case for an electronic device, the method comprising: orienting a second panel of the case about a first axis of rotation leading with a second panel outer side of the second panel until the second panel is approximately parallel with a first panel of the case; orienting a third panel of the case about a second axis of rotation leading with a third panel outer side of the third panel until the third panel outer side is substantially flush with the second panel outer side and the first panel outer side; and electrically coupling an electronic device with at least one control mechanism of the case to provide communication between the electronic device and the at least one control mechanism. The first panel can comprise a first panel inner side, a first panel outer side, and a first panel connection side comprising the at least one control mechanism. The second panel can comprise a second panel inner side, the second panel outer side, a first second panel connection side, and a second second panel connection side. The third panel can comprise a third panel inner side, the third panel outer side, and a third panel connection side. The second panel inner side can comprise a cradle configured to receive the electronic device. The first panel connection side can be coupled to the first second panel connection side forming the first axis of rotation, and the third connection side can be coupled to the second second panel connection side forming the second axis of rotation.

Figure 2:
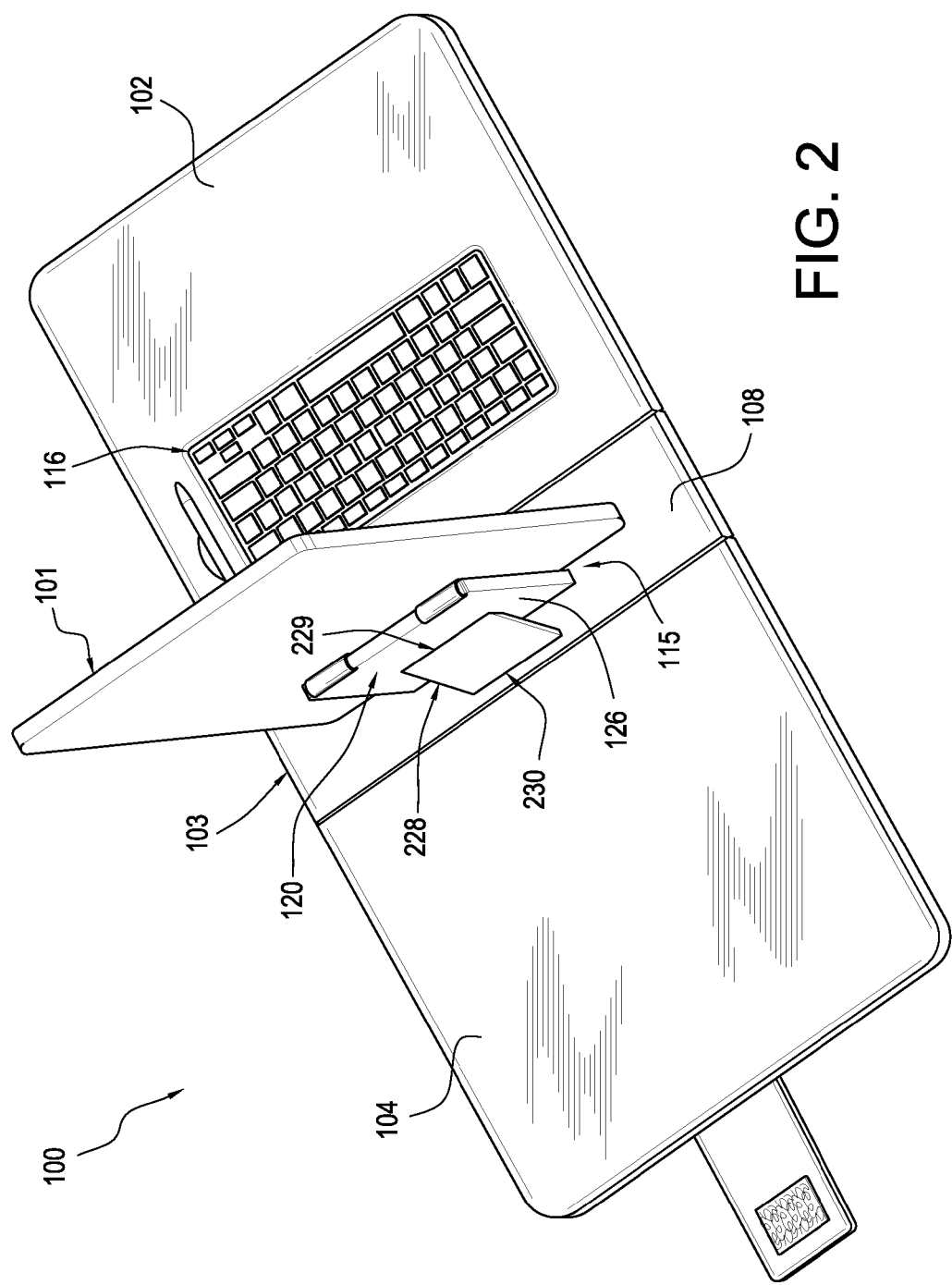
FIG. 2 illustrates a left rear isometric view of the exemplary electronic device accessory, according to the embodiment of FIG. 1, where the exemplary electronic device accessory is in the first open configuration.

Turning to the drawings, FIG. 1 illustrates a left front isometric view of an exemplary electronic device accessory 100 for electronic device 101. Electronic device accessory 100 can be configured such that electronic device 101 can be located in and/or held by electronic device accessory 100. In some embodiments, electronic device accessory 100 can be referred to as a case for electronic device 101. In many embodiments, electronic device 101 can comprise a mobile electronic device, as described above. In some embodiments, electronic device accessory 100 can comprise electronic device 101 (e.g., as illustrated by FIG. 2). However, FIG. 1 illustrates electronic device 101 when electronic device 101 is located separately from electronic device accessory 100. In many embodiments, electronic device accessory 100 can provide protection for electronic device 101 and/or can facilitate external control of electronic device 101. Electronic device accessory 100 is merely exemplary and is not limited to the embodiments presented herein. Electronic device accessory 100 can be employed in many different embodiments or examples not specifically depicted or described herein.

In many embodiments, electronic device accessory 100 can be configured such that electronic device 101 may remain enclosed in an other electronic device case (not shown) while electronic device 101 is located in and/or held by electronic device accessory 100. The other electronic device case (not shown) will typically be smaller than electronic device accessory 100. The embodiments disclosed herein can provide electronic device 101 with additional protection. Still, in these or other embodiments, even where electronic device 101 is not enclosed in the other electronic device case (not shown), electronic device accessory 100 can still be configured such that electronic device 101 can be located in and/or held by electronic device accessory 100.

Electronic device accessory 100 comprises first panel 102, second panel 103, and third panel 104. First panel 102 comprises first panel inner side 105, first panel outer side 106, and first panel connection side 107. Second panel 103 comprises second panel inner side 108, second panel outer side 109, first second panel connection side 110, and second second panel connection side 111. Third panel 104 comprises third panel inner side 112, third panel outer side 113, and third panel connection side 114. Electronic device accessory 100, second panel 103, and/or second panel inner side 108 can comprise cradle 115. Cradle 115 can be coupled to and/or can be integral with second panel inner side 108. First panel 102 and/or first panel inner side 105 can comprise one or more control mechanism(s) 116.

First panel connection side 107 can be coupled to first second panel connection side 110 forming first axis of rotation 117. Third panel connection side 114 can be coupled to second second panel connection side 111 forming second axis of rotation 118.

Cradle 115 can comprise first barrier 119 and/or second barrier 120. First barrier 119 can comprise first barrier device surface 121, first barrier outer surface 122, first barrier bottom side 123, and first barrier top side 124. Meanwhile, second barrier 120 can comprise second barrier device surface 125, second barrier outer surface 126, second barrier bottom side 127, and second barrier top side 128. In some embodiments, when cradle 115 is integral with second panel 103, first barrier 119 may not comprise first barrier outer surface 122, first barrier bottom side 123, and/or first barrier top side 124. In the same or different embodiments, second barrier 120 may not comprise second barrier outer surface 126, second barrier bottom side 127, and/or second barrier top side 128.

In various embodiments, first barrier bottom side 123 can be coupled to second panel inner side 108. Second barrier bottom side 127 can be coupled to second panel inner side 108. First barrier device surface 121 can face and/or can be configured to face second barrier device surface 125.

In some embodiments, electronic device accessory 100, first panel 102, and/or third panel 104 can comprise linking mechanism 131.

In various embodiments, electronic device accessory 100, cradle 115, and/or second panel inner surface 108 can comprise port 132. In other embodiments, electronic device accessory 100 can comprise a communication module (not shown) in addition to or instead of port 132. In further embodiments, electronic device accessory 100 can comprise a coupling mechanism 150 and/or stylus 151. In many embodiments, cradle 115, first barrier device surface 121, and/or second barrier device surface 125 can comprise one or more protection mechanism(s) 133. Additional details of these elements of electronic device accessory 100 are explained below.

Turning to the next drawing, FIG. 2 illustrates a left rear isometric view of the exemplary electronic device accessory 100 for electronic device 101, according to the embodiment of FIG. 1. FIG. 2 illustrates electronic device 101 (FIG. 1) when electronic device 101 (FIG. 1) is received at and/or located at cradle 115 (FIG. 1) of electronic device accessory 100 (FIG. 1).

In some embodiments, cradle 115 can comprise support mechanism 228. Support mechanism 228 can comprise top support mechanism portion 229 and bottom support mechanism portion 230. Top support mechanism portion 229 can be coupled to second barrier outer surface 126. Bottom support mechanism portion 230 can be coupled to second panel inner side 108. Support mechanism 228 can be configured to provide structural support to second barrier 120.

Returning now to FIG. 1, cradle 115 can be configured to receive electronic device 101. First barrier device surface 121 and second barrier device surface 125 are configured such that when cradle 115 receives electronic device 101, cradle 115 receives electronic device 101 between first barrier device surface 121 and second barrier device surface 125. Accordingly, first barrier device surface 121 and second barrier device surface 125 can form a channel running the length of cradle 115. As a result, the channel formed by first barrier device surface 121 and second barrier device surface 125 can be configured to receive an edge of electronic device 101, thereby allowing electronic device 101 to be positioned in either of a landscape or portrait orientation.

In many embodiments, cradle 115 can be configured in a manner to prevent electronic device 101 from unintentionally exiting electronic device accessory 100 and/or cradle 115. In some embodiments, cradle 115 can be configured to clamp onto and secure electronic device 101 at electronic device accessory 100.

Linking mechanism 131 can be configured to couple first panel 102 to third panel 104 in order to limit movement of third panel 104 about second axis of rotation 118 and to limit movement of first panel 102 about first axis of rotation 117. Linking mechanism 131 can also be used to keep electronic device accessory 100 in a closed configuration. In some embodiments, linking mechanism 131 can comprise a strap or belt coupled to one or both of first panel 102 and/or third panel 104. The strap or belt can be configured to be removably coupled together and/or to the other of first panel 102 or third panel 104, as appropriate, by any suitable fastener (e.g., a hook and loop fastener (e.g., Velcro® material), a button and snap fastener, a buckle fastener, etc.). In other embodiments, linking mechanism 131 can comprise a zipper assembly (as described below and illustrated with respect to FIG. 10) configured to at least partially enclose electronic device 101 within electronic device assembly 100.

Figure 6:
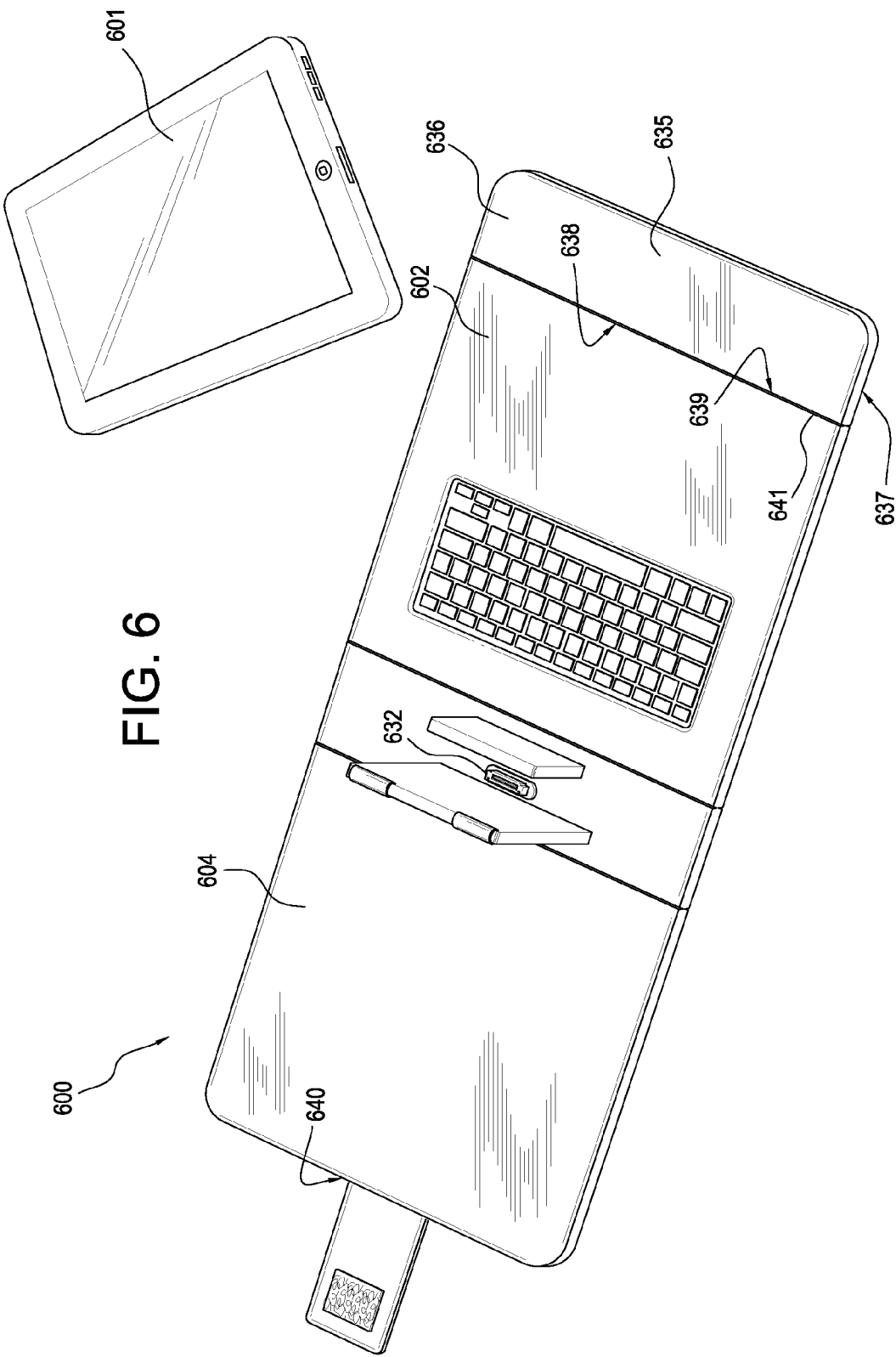
FIG. 6 illustrates a left front isometric view of an exemplary electronic device accessory for an electronic device, according to another embodiment.

Port 132 can be configured to electrically couple electronic device 101 to control mechanism(s) 116 to provide wired communication between electronic device 101 and control mechanism(s) 116. Accordingly, port 132 can be electrically coupled with control mechanism(s) 116. Port 132 can comprise any suitable and/or appropriate electrical connector (e.g., a high-definition multimedia interface (HDMI) cable, a digital visual interface (DVI) cable, a display port (DP) cable, a video graphics array (VGA) cable, composite cables, an S-Video cable, an optical audio cable, a universal serial bus (USB) cable, Radio Corporation of America (RCA) cables, a tip-ring-sleeve (TRS) cable such as a 3.5 millimeter TRS cable, a dock connector such a 30-pin dock connector by Apple Inc. of Cupertino, Calif., etc.) configured to electrically couple with a corresponding/matching electrical connector of electronic device 101. Where appropriate, port 132 can also be configured to electrically couple electronic device 101 to the other control mechanism(s), described below with respect to electronic device accessory 600 (FIG. 6). In some embodiments, port 132 can be omitted from electronic device accessory 100.

The communication module can be configured to electrically couple electronic device 101 to control mechanism(s) 116 and/or the other control mechanism(s) (described below with respect to electronic device accessory 600 (FIG. 6)) to provide wireless communication between electronic device 101 and control mechanism(s) 116 and/or the other control mechanism(s), as applicable. The communication module can be configured to electrically couple electronic device 101 to control mechanism(s) 106 and/or the other control mechanism(s) via a wireless network, as described above. In some examples, the wireless network can comprise a Bluetooth™ wireless network and/or a Wi-Fi wireless network, such as, an IEEE 802.11 wireless network.

Coupling mechanism 150 can be coupled to electronic device accessory 100 and/or third panel 104. Coupling mechanism 150 can be configured to receive stylus 151, and stylus 151 can be configured to operate electronic device 101. For example, stylus 151 can be configured to operate a user interface (e.g., a touch screen display) of electronic device 101.

Protection mechanism(s) 133 can be configured to prevent damage to electronic device 101. For example, protection mechanism(s) 133 can comprise rubber and/or plastic barrier(s). Protection mechanism(s) 133 can operate to limit wear on electronic device 101. Likewise, protection mechanism(s) 133 can further operate to better secure electronic device 101 in cradle 115.

Control mechanism(s) 116 can be configured to communicate with and operate electronic device 101. Control mechanism(s) 116 can comprise a keyboard and/or a touch mouse pad. In some embodiments, the keyboard can comprise a standard QWERTY computer keyboard. In other embodiments, the keyboard can be a custom-made computer keyboard.

In some embodiments, control mechanism(s) 116 can be coupled to first panel 102 and/or first panel inner side 105. In these or other embodiments, control mechanism(s) 116 can be configured to be located within first panel inner side 105, such as, by counter-sinking control mechanism(s) 116 within first panel inner side 105 (such that, for example, the top surface of the key(s) of control mechanism(s) 116 are flush with or below the top surface of first panel inner side 105), molding first panel 102 around control mechanism(s) 116 during the manufacturing process, and the like.

First panel 102 can be implemented as any suitable rectangular, square, or other shaped panel having a material dependent thickness sufficient to provide at least partial support to electronic device 101 when electronic device 101 is located in cradle 115, such as, in the portrait orientation of electronic device 101 illustrated by FIG. 2. Meanwhile, second panel 103 can be implemented as any suitable rectangular shaped rigid panel. In some embodiments, second panel 103 can operate like a spine to electronic device accessory 100. Furthermore, third panel 104 can be implemented as any suitable rectangular or square shaped panel. In some embodiments, third panel 104 can contribute to supporting electronic device 101 when electronic device 101 is located in cradle 115, such as, in the portrait orientation of electronic device 101 illustrated by FIG. 2. In other embodiments, third panel 104 may contribute little or not at all to supporting electronic device 101. For example, in these embodiments, third panel 104 can comprise a non-rigid and/or flexible material.

As referenced in the previous paragraph, first panel 102, second panel 103, third panel 104, and/or fourth panel 635 (FIG. 6) can comprise a rigid material. The rigid material can comprise any suitable material(s) comprising sufficient rigidity as described above, such as, for example plastic, metal, or wood. In the same or different embodiments, first panel 102, second panel 103, third panel 104, and/or fourth panel 635 (FIG. 6) can comprise a non-rigid and/or flexible material. The non-rigid and/or flexible material can comprise fabric, rubber or some other elastomer, non-breakable plastic that is flexible, and the like.

In some embodiments, lengths of first second panel connection side 110 and second second panel connection side 111 can be substantially similar to the length of first panel connection side 107 and/or third panel connection side 114. Likewise, as described below, second first panel connection side 639 (FIG. 6) and/or second third panel connection side 640 (FIG. 6) can be substantially similar to the length of fourth panel connection side 638 (FIG. 6), as applicable. In many embodiments, first panel 102 and/or first panel connection side 107 can be coupled to second panel 103 and/or first second panel connection side 110 at first axis of rotation 117 by a first hinge, and third panel 104 and/or third panel connection side 114 can be coupled to second panel 103 and/or second second panel connection side 111 at second axis of rotation 118 by a second hinge. Where applicable, as described below, fourth panel 635 and/or fourth panel connection side 638 can be coupled to first panel 602 and/or second first panel connection side 639 or third panel 604 and/or second third panel connection side 640 at third axis of rotation 641 by a third hinge. The first hinge, the second hinge, and/or the third hinge can each comprise a mechanical hinge or a living hinge. Where applicable, the living hinge can be implemented using any suitable flexible material, such as, for example fabric, rubber, and the like.

Figure 3:
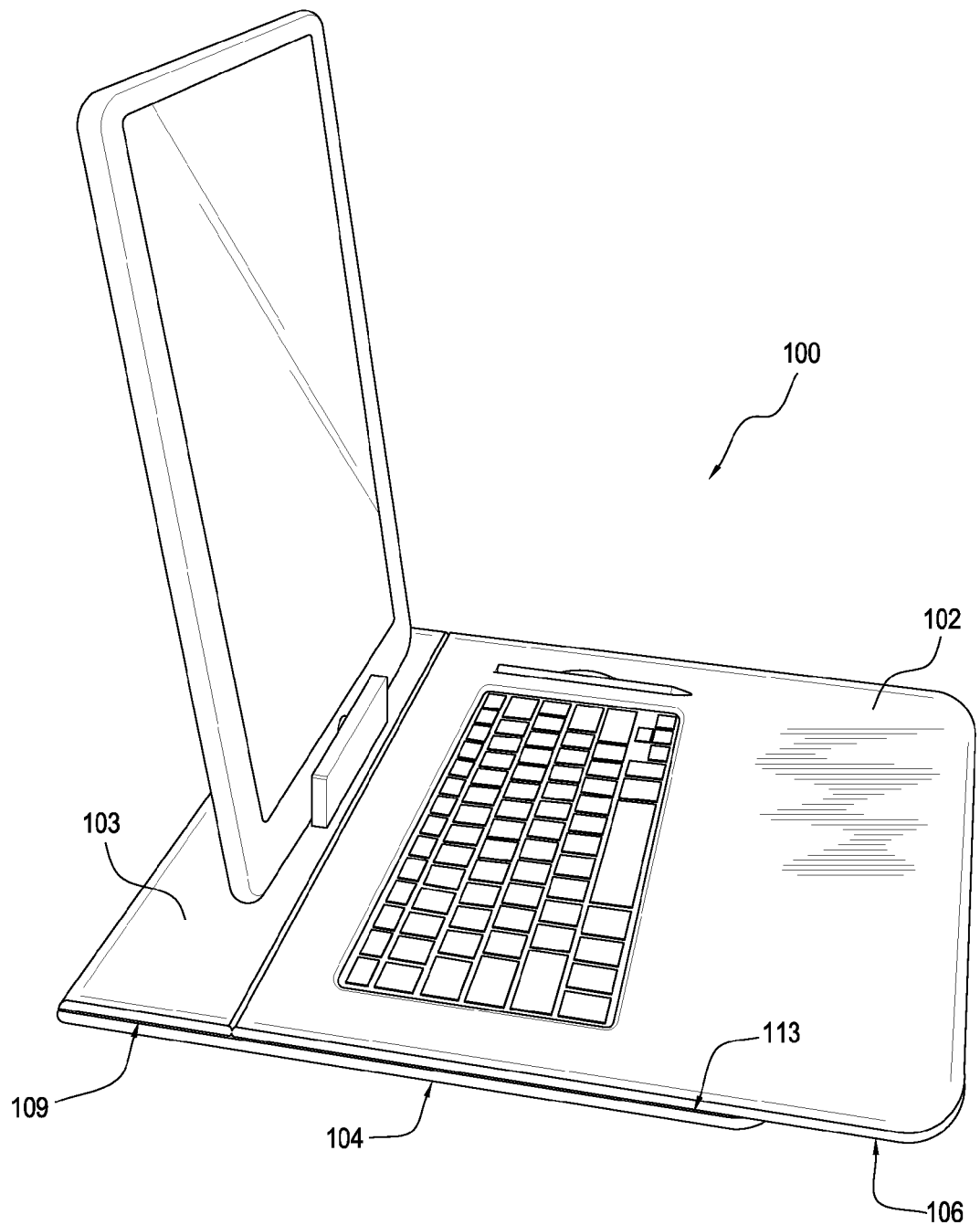
FIG. 3 illustrates the exemplary electronic device accessory of FIGS. 1 and 2 in a second open configuration.

Electronic device accessory 100 can be configured such that when electronic device accessory 100 is positioned in an open configuration, third panel outer side 113 faces first panel outer side 106 and second panel outer side 109. FIG. 3 illustrates exemplary electronic device accessory 100 (FIG. 1) in the open configuration. When electronic device accessory 100 is positioned in the open configuration, first panel outer side 106 of first panel 102 and second panel outer side 109 of second panel 103 form a substantially planar surface that is substantially parallel to third panel outer surface 113 of third panel 104.

Figure 4:
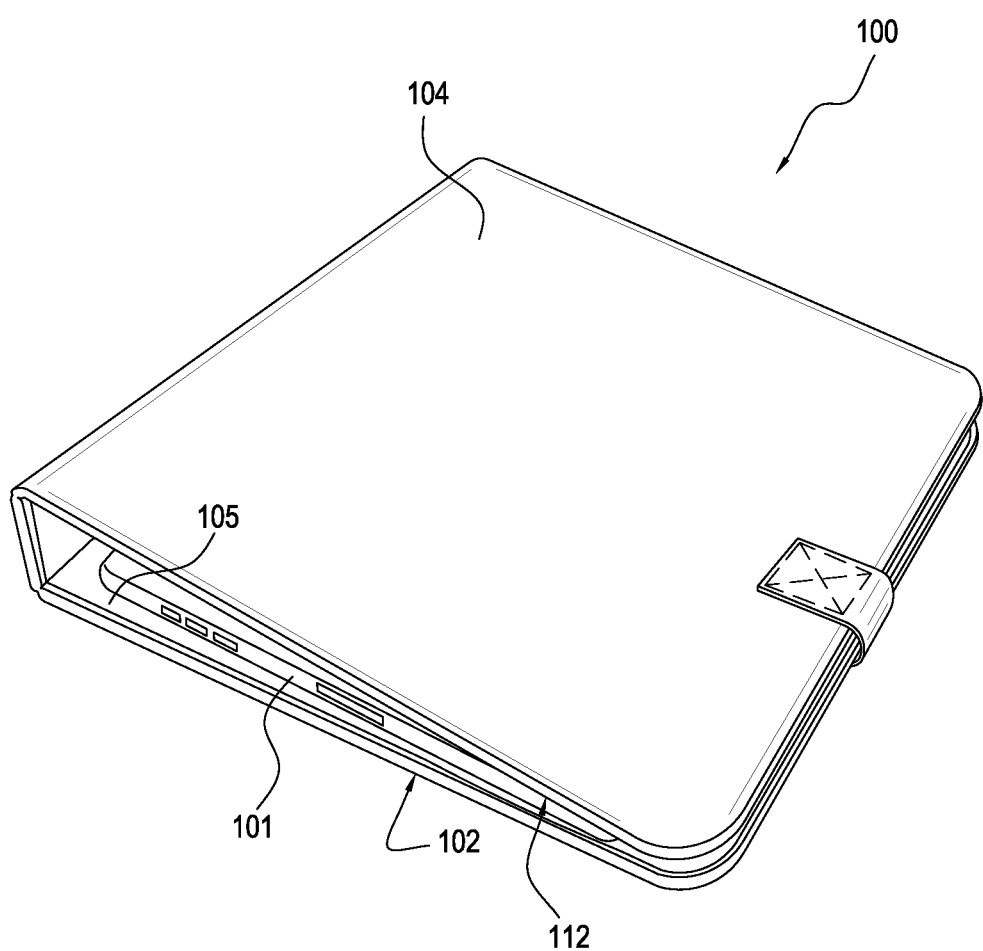
FIG. 4 illustrates the exemplary electronic device accessory of FIGS. 1-3 in a closed configuration.

Meanwhile, electronic device accessory 100 can also be configured such that when electronic device accessory 100 is positioned in a closed configuration, third panel inner side 112 of third panel 104 faces first panel inner side 105 of first panel 102. For example, FIG. 4 illustrates exemplary electronic device accessory 100 in the closed configuration with linking mechanism 131 operating to maintain electronic device accessory 100 in the closed configuration while electronic device accessory 100 holds electronic device 101. When electronic device accessory 100 is positioned in the closed configuration and when electronic device 101 is received at cradle 115 (not shown), electronic device 101 can be located between first panel inner side 105 (FIG. 1) and third panel inner side 112 (FIG. 1).

Figure 10:
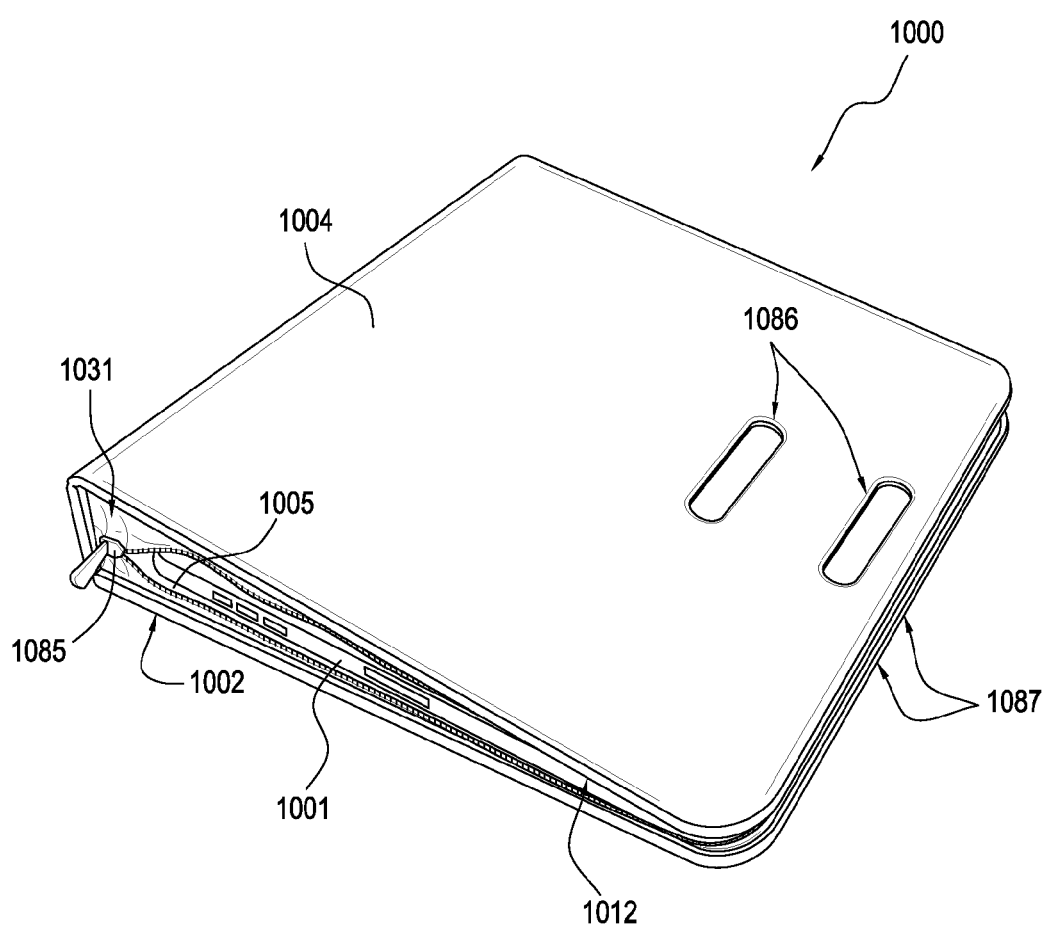
FIG. 10 illustrates an exemplary electronic device accessory for an electronic device, according to another embodiment, where the exemplary electronic device accessory is in a closed configuration.

In another related example, FIG. 10 illustrates exemplary electronic device accessory 1000 in the closed configuration with linking mechanism 1031 operating to maintain electronic device accessory 1000 in the closed configuration while electronic device accessory 1000 holds electronic device 1001. Electronic device accessory 1000 can be similar to electronic device accessory 100 (FIG. 1), and electronic device 1001 can be similar or identical to electronic device 101 (FIG. 1). Accordingly, when electronic device accessory 1000 is positioned in the closed configuration and when electronic device 1001 is received at a cradle (not shown) of electronic device accessory 1001, electronic device 1001 can be located between first panel inner side 1005 of first panel 1002 and third panel inner side 1012 of third panel 1004. Meanwhile, third panel 1004 can comprise one or more handles 1086, and/or first panel 1002 can comprise one or more handles 1087 (referenced but not shown). First panel 1002 can be similar to first panel 102 (FIG. 1), and third panel 1004 can be similar to third panel 104 (FIG. 1). Each of handle(s) 1086 can be implemented as a recess in or an aperture or hole through third panel 1004. Handle(s) 1087 can be similar or identical and/or can correspond to handle(s) 1086.

In these or other embodiments, linking mechanism 1031 can comprise zipper assembly 1085. Zipper assembly 1085 can be configured to at least partially enclose electronic device 1001 within electronic device assembly 1000.

Returning briefly to FIG. 1, in operation, electronic device accessory 100 can provide a user an opportunity to use electronic device 101 in various situations where having supported control mechanism(s) 116 and associated support for electronic device 101 is desired. In some embodiments, when electronic device 101 is utilized as part of electronic device accessory 100, electronic device accessory 100 can be configured to permit the user to use electronic device 101 upon the user's lap or other comfortable locations.

Figure 5:
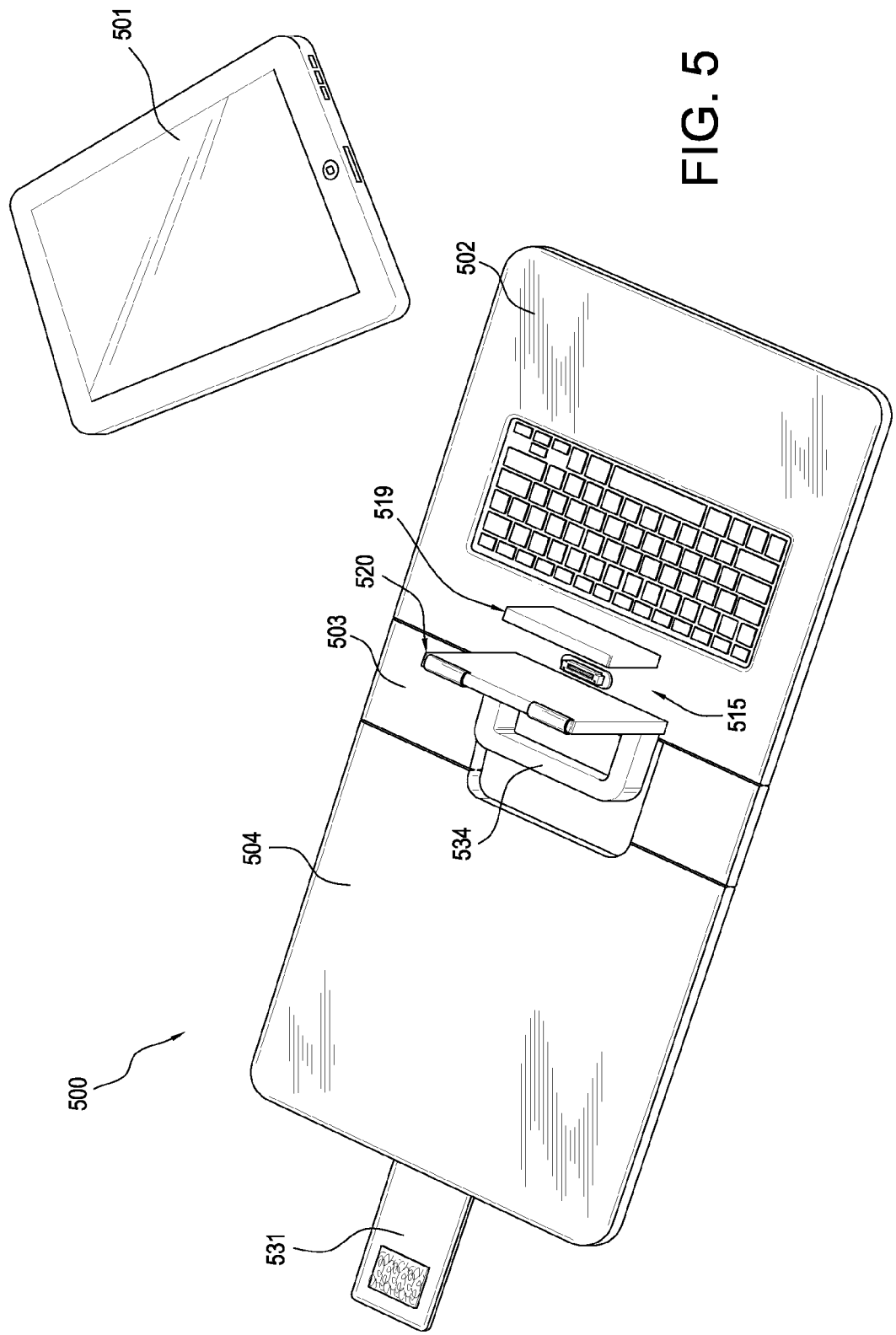
FIG. 5 illustrates a left front isometric view of an exemplary electronic device accessory for an electronic device, according to another embodiment, where the exemplary electronic device accessory is in an open configuration.

Returning to the drawings, FIG. 5 illustrates a left front isometric view of an exemplary electronic device accessory 500 for electronic device 501 in an open configuration. Electronic device accessory 500 can be similar to electronic device accessories 100 (FIG. 1) and 1000 (FIG. 10). Electronic device 501 can be similar or identical to electronic devices 101 (FIG. 1) and 1001 (FIG. 10).

Electronic device accessory 500 can comprise cradle 515. Cradle 515 can be similar to cradle 115 (FIG. 1). Cradle 515 can be coupled to first panel 502, and first panel 502 can be similar to first panel 102 (FIG. 1).

Meanwhile, electronic device accessory 500 can comprise handle 534. Handle 534 can be coupled to or integral with first panel 502 and/or cradle 515. Electronic device 500 can also comprise linking mechanism 531. Linking mechanism 531 can be similar or identical to linking mechanism 131 (FIG. 1).

Figure 11:
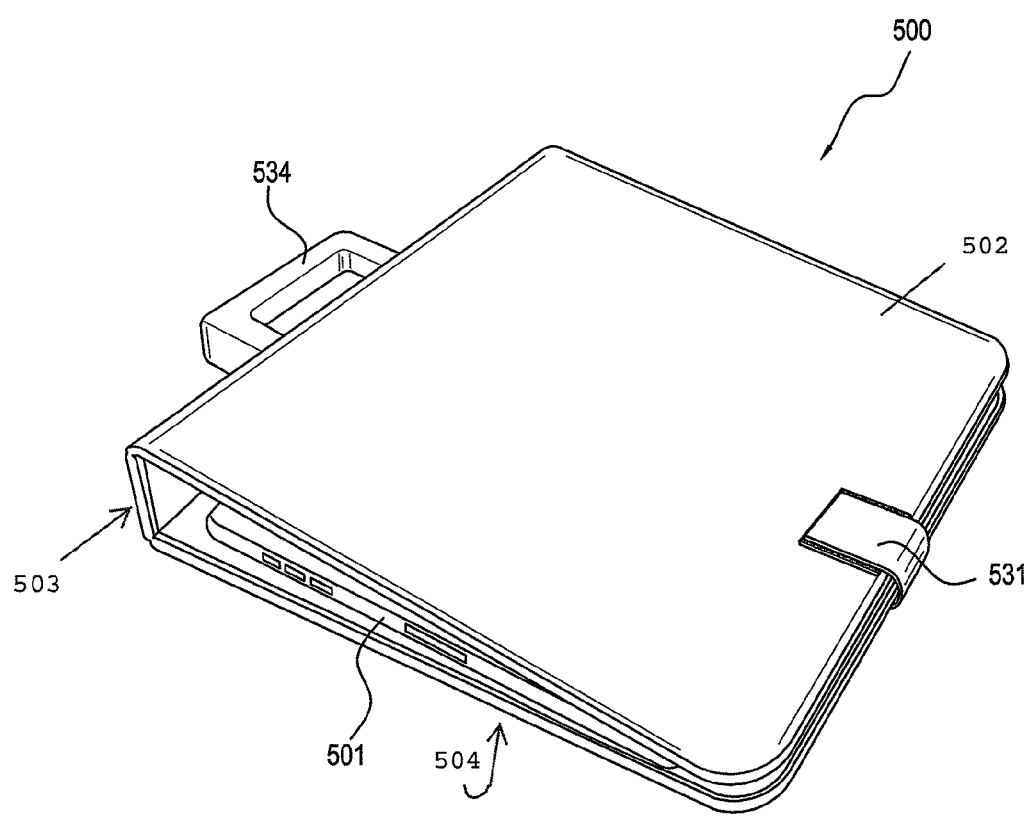
FIG. 11 illustrates the exemplary electronic device accessory of FIG. 5 while the electronic device accessory is holding the electronic device, where the electronic device accessory is in a closed configuration.

In many embodiments, second panel 503 and/or third panel 504 can be configured and/or shaped (e.g., with cutouts and/or molding) to permit second panel 503 and/or third panel 504 to pass around handle 534 when electronic device accessory 500 is repositioned between an open and closed configuration (shown at FIG. 11). Second panel 503 can be similar to second panel 103 (FIG. 1), and third panel 504 can be similar to third panel 104 (FIG. 1). The open and closed configurations can be similar or identical to the open and closed configurations described above with respect to electronic device accessories 100 (FIG. 1) and 1000 (FIG. 10).

For example, handle 534 can be external to electronic device accessory 500 when electronic device accessory 500 is in the closed configuration such that a user can use handle 534 to carry electronic device accessory 500 in the closed configuration (with or without electronic device 501 inside electronic device accessory 500 and/or located at cradle 515 of electronic device accessory 500. In the same or different embodiments, handle 534 can be configured to fully or partially retract into electronic device accessory 500 when not in use to permit a reduction in size to any cutouts and/or molding, as described above, of first panel 502 and/or third panel 504, where applicable. Meanwhile, in many embodiments, second barrier 520 of cradle 515 can comprise a flexible material with sufficient flexibility to temporarily bend toward first barrier 519 of cradle 515 so barrier 520 does not prevent electronic device accessory 500 from being positioned in a closed configuration and such that handle 534 remains substantially parallel with first panel 502 when electronic device accessory 500 is in the closed position.

Handle 534 can comprise the same material as first panel 502, second panel 503, and/or third panel 504. In other embodiments, handle 534 can comprise different material(s) than first panel 502, second panel 503, and/or third panel 504.

In some embodiments, handle 534 can be configured to pivot, such as by a hinge or other suitable device, about the location(s) at which handle 534 is coupled with first panel 502 and cradle 515, where applicable. In these embodiments, pivoting handle 534 can facilitate movement of second panel 503 and/or third panel 504 about handle 534 when electronic device accessory 500 is repositioned between an open and closed configuration. In other embodiments, handle 534 and second barrier 520 remain stationary relative to first panel 502 such that it does not pivot.

FIG. 11 illustrates electronic device accessory 500 while holding electronic device 501 and while in the closed configuration and inverted. Linking mechanism 531 can be engaged (as shown) to maintain electronic device accessory 500 in the closed configuration. Meanwhile, handle 534 is shown external to electronic device accessory 500 while electronic device accessory 500 is in the closed configuration, as described above with respect to FIG. 5.

Returning again to the drawings, FIG. 6 illustrates a left front isometric view of an exemplary electronic device accessory 600 for electronic device 601. Electronic device accessory 600 can be similar or identical to electronic device accessories 100 (FIG. 1), 500 (FIG. 5), and 1000 (FIG. 10). Electronic device 601 can be similar or identical to electronic devices 101 (FIG. 1), 501 (FIG. 5), and 1001 (FIG. 10).

Electronic device accessory 600 can comprise fourth panel 635. Fourth panel 635 can comprise fourth panel inner side 636, fourth panel outer side 637, and fourth panel connection side 638. Meanwhile, electronic device accessory 600 can comprise first panel 602 and third panel 604. First panel 602 can be similar or identical to first panel 102 (FIG. 1), and third panel 604 can be similar or identical to third panel 104 (FIG. 1).

First panel 602 can comprise second first panel connection side 639. Third panel 604 can comprise second third panel connection side 640. Fourth panel connection side 638 can be coupled to second first panel connection side 639 or second third panel connection side 640 forming third axis of rotation 641.

Fourth panel inner side 636 can comprise an ergonomic wrist pad and/or one or more other control mechanism(s). The one or more other control mechanism(s) can comprise a touch mouse pad and/or a numeric keypad. The one or more other control mechanism(s) can be electrically coupled to port 632 and/or the communication module as described above with respect to electronic device accessory 100 (FIG. 1). Port 632 can be similar or identical to port 132 (FIG. 1).

Figure 7:
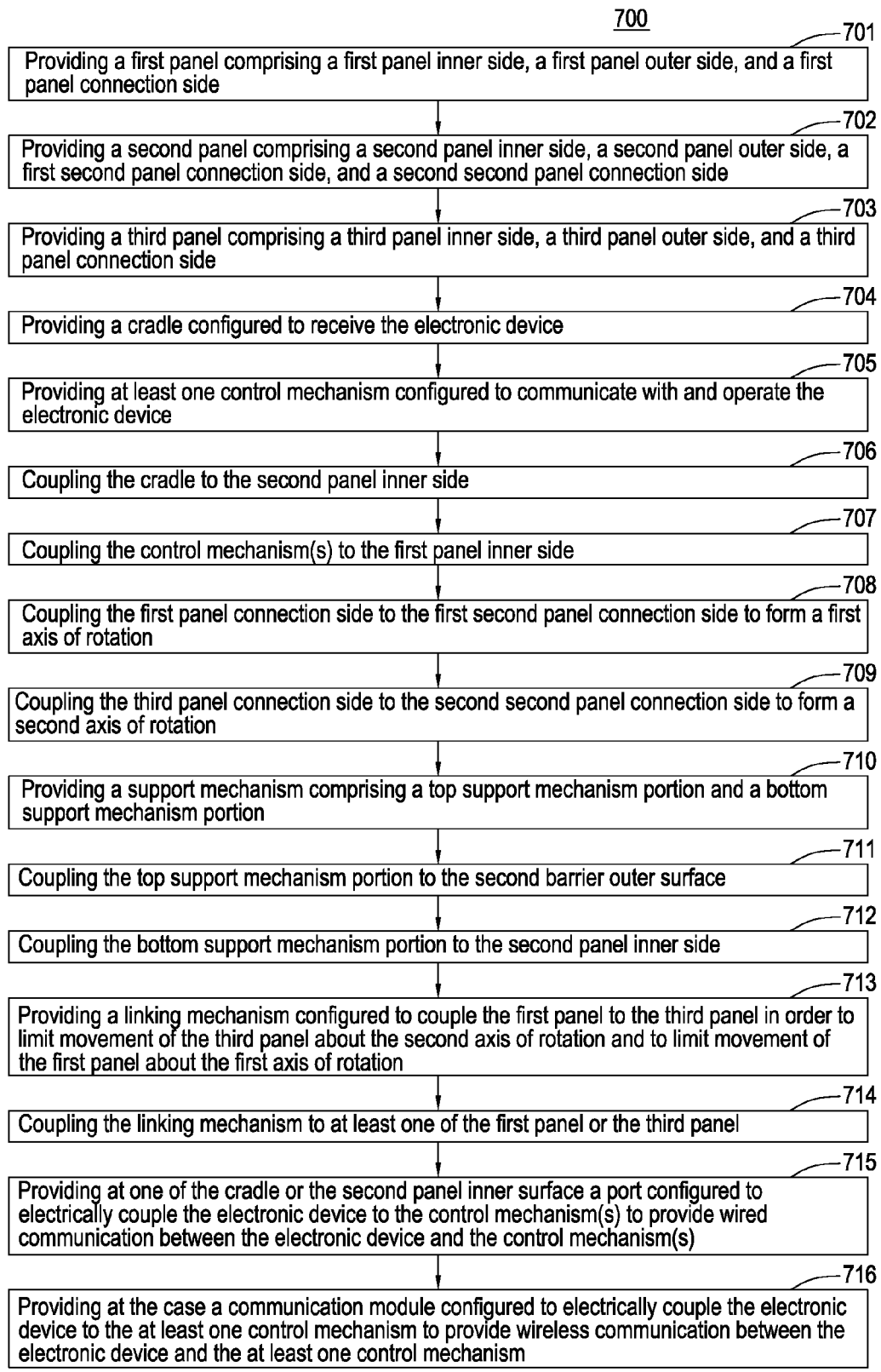
FIG. 7 illustrates a flow chart for an embodiment of a method 700 of providing a case for an electronic device.

FIG. 7 illustrates a flow chart for an embodiment of a method 700 of providing a case for an electronic device. Method 700 is merely exemplary and is not limited to the embodiments presented herein. Method 700 can be employed in many different embodiments or examples not specifically depicted or described herein. In some embodiments, the procedures, the processes, and/or the activities of method 700 can be performed in the order presented. In other embodiments, the procedures, the processes, and/or the activities of the method 700 can be performed in any other suitable order. In still other embodiments, one or more of the procedures, the processes, and/or the activities in method 700 can be combined or skipped. The case can be similar or identical to electronic device accessory 100 (FIG. 1), and the electronic device can be similar or identical to electronic device 101 (FIG. 1).

Referring now to FIG. 7, method 700 can comprise procedure 701 of providing a first panel comprising a first panel inner side, a first panel outer side, and a first panel connection side. The first panel can be similar or identical to first panel 102 (FIG. 1). Accordingly, the first panel inner side can be similar or identical to first panel inner side 105 (FIG. 1); the first panel outer side can be similar or identical to first panel outer side 106 (FIG. 1); and/or the first panel connection side can be similar or identical to first panel connection side 107 (FIG. 1).

Method 700 can comprise procedure 702 of providing a second panel comprising a second panel inner side, a second panel outer side, a first second panel connection side, and a second second panel connection side. The second panel can be similar or identical to second panel 103 (FIG. 1). Accordingly, the second panel inner side can be similar or identical to second panel inner side 108 (FIG. 1); the second panel outer side can be similar or identical to second panel outer side 109 (FIG. 1); the first second panel connection side can be similar or identical to first second panel connection side 110 (FIG. 1); and/or the second second panel connection side can be similar or identical to second second panel connection side 111 (FIG. 1).

Method 700 can comprise procedure 703 of providing a third panel comprising a third panel inner side, a third panel outer side, and a third panel connection side. The third panel can be similar or identical to third panel 104 (FIG. 1). Accordingly, the third panel inner side can be similar or identical to third panel inner side 112 (FIG. 1); the third panel outer side can be similar or identical to third panel outer side 113 (FIG. 1); and/or the third panel connection side can be similar or identical to third panel connection side 114 (FIG. 1).

Figure 8:
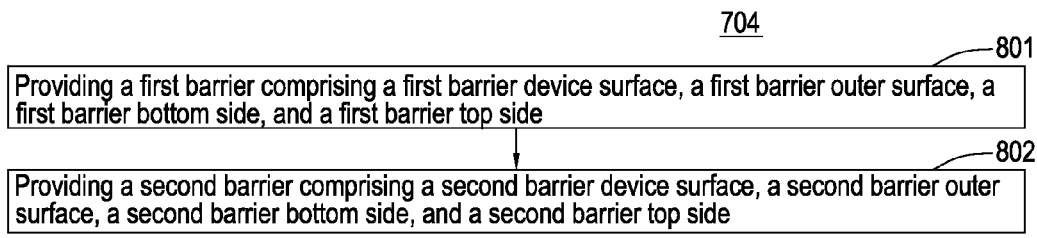
FIG. 8 illustrates a flow chart for an exemplary procedure of providing a cradle configured to receive the electronic device, according to the embodiment of FIG. 7.

Method 700 can comprise procedure 704 of providing a cradle configured to receive the electronic device. The cradle can be similar or identical to cradle 115 (FIG. 1). In some embodiments, procedure 704 can be performed as part of procedure 702, in which case procedure 706 (below) can be omitted. FIG. 8 illustrates a flow chart for an exemplary embodiment of procedure 704 of providing a cradle configured to receive the electronic device, according to the embodiment of FIG. 7.

Referring to FIG. 8, procedure 704 can comprise process 801 of providing a first barrier comprising a first barrier device surface, a first barrier outer surface, a first barrier bottom side, and a first barrier top side. The first barrier can be similar or identical to first barrier 119 (FIG. 1). Accordingly, the first barrier device surface can be similar or identical to first barrier device surface 121; the first barrier outer surface can be similar or identical to first barrier outer surface 122; the first barrier bottom side can be similar or identical to first barrier bottom side 123; and the first barrier top side can be similar or identical to first barrier top side 124.

Procedure 704 can comprise process 802 of providing a second barrier comprising a second barrier device surface, a second barrier outer surface, a second barrier bottom side, and a second barrier top side. The second barrier can be similar or identical to second barrier 120 (FIG. 1). Accordingly, the second barrier device surface can be similar or identical to second barrier device surface 125; the second barrier outer surface can be similar or identical to second barrier outer surface 126; the second barrier bottom side can be similar or identical to second barrier bottom side 127; and/or the second barrier top side can be similar or identical to second barrier top side 128.

Returning now to FIG. 7, method 700 can comprise procedure 705 of providing at least one control mechanism configured to communicate with and operate the electronic device. In many embodiments, the control mechanism(s) can be similar or identical to control mechanism(s) 116 (FIG. 1).

Method 700 can comprise procedure 706 of coupling the cradle to the second panel inner side. In some embodiments, procedure 706 can comprise coupling the first barrier bottom side to the second panel inner side and coupling the second barrier bottom side to the second panel inner side such that the first barrier device surface faces the second barrier device surface. In some embodiments, procedure 706 can be omitted, as describe above.

Method 700 can comprise procedure 707 of coupling the control mechanism(s) to the first panel inner side. The control mechanism(s) can be similar or identical to control mechanism(s) 116 (FIG. 1). The control mechanism(s) can be coupled to the first panel inner side in a manner similar to that described above with respect to electronic device accessory 100 (FIG. 1).

Method 700 can comprise procedure 708 of coupling the first panel connection side to the first second panel connection side to form a first axis of rotation. The first axis of rotation can be similar or identical to first axis of rotation 117 (FIG. 1). Procedure 708 can be omitted in some embodiments if the first second panels are coupled together with a living hinge.

Method 700 can comprise procedure 709 of coupling the third panel connection side to the second second panel connection side to form a second axis of rotation. The second axis of rotation can be similar or identical to second axis of rotation 118 (FIG. 1). Procedure 709 can be omitted in some embodiments if the second and third panels are coupled together with a living hinge.

Method 700 can comprise procedure 710 of providing a support mechanism comprising a top support mechanism portion and a bottom support mechanism portion. The support mechanism can be similar or identical to support mechanism 228 (FIG. 2). Meanwhile, the top support mechanism portion can be similar or identical to top support mechanism portion 229, and the bottom support mechanism portion can be similar or identical to bottom support mechanism portion 230 (FIG. 2).

Method 700 can comprise procedure 711 of coupling the top support mechanism portion to the second barrier outer surface. Performing procedure 711 can be performed in a manner similar or identical to that described above with respect to electronic device accessory 100 (FIG. 1). Method 700 can also comprise procedure 712 of coupling the bottom support mechanism portion to the second panel inner side. Performing procedure 712 can be performed in a manner similar or identical to that described above with respect to electronic device accessory 100 (FIG. 1). Where procedure 710 is omitted, procedures 711 and 712 can also be omitted.

Method 700 can comprise procedure 713 of providing a linking mechanism configured to couple the first panel to the third panel in order to limit movement of the third panel about the second axis of rotation and to limit movement of the first panel about the first axis of rotation, and/or for other reasons explained above. The linking mechanism can be similar or identical to linking mechanism 131 (FIG. 1).

Method 700 can comprise procedure 714 of coupling the linking mechanism to at least one of the first panel or the third panel. Performing procedure 714 can be performed in a manner similar or identical to that described above with respect to electronic device accessory 100 (FIG. 1). Where procedure 713 is omitted, procedure 714 can also be omitted.

Method 700 can comprise procedure 715 of providing at one of the cradle or the second panel inner surface a port configured to electrically couple the electronic device to the control mechanism(s) to provide wired communication between the electronic device and the control mechanism(s). The port can be similar or identical to port 132 (FIG. 1).

Method 700 can comprise procedure 716 of providing at the case a communication module configured to electrically couple the electronic device to the at least one control mechanism to provide wireless communication between the electronic device and the at least one control mechanism. The communication module can be similar or identical to the communication module described above with respect to electronic device accessory 100 (FIG. 1). In many embodiments, procedure 716 can be omitted.

In many embodiments, any of procedures 706 through 716 can occur after one or more of procedures 701 through 705.

Figure 9:
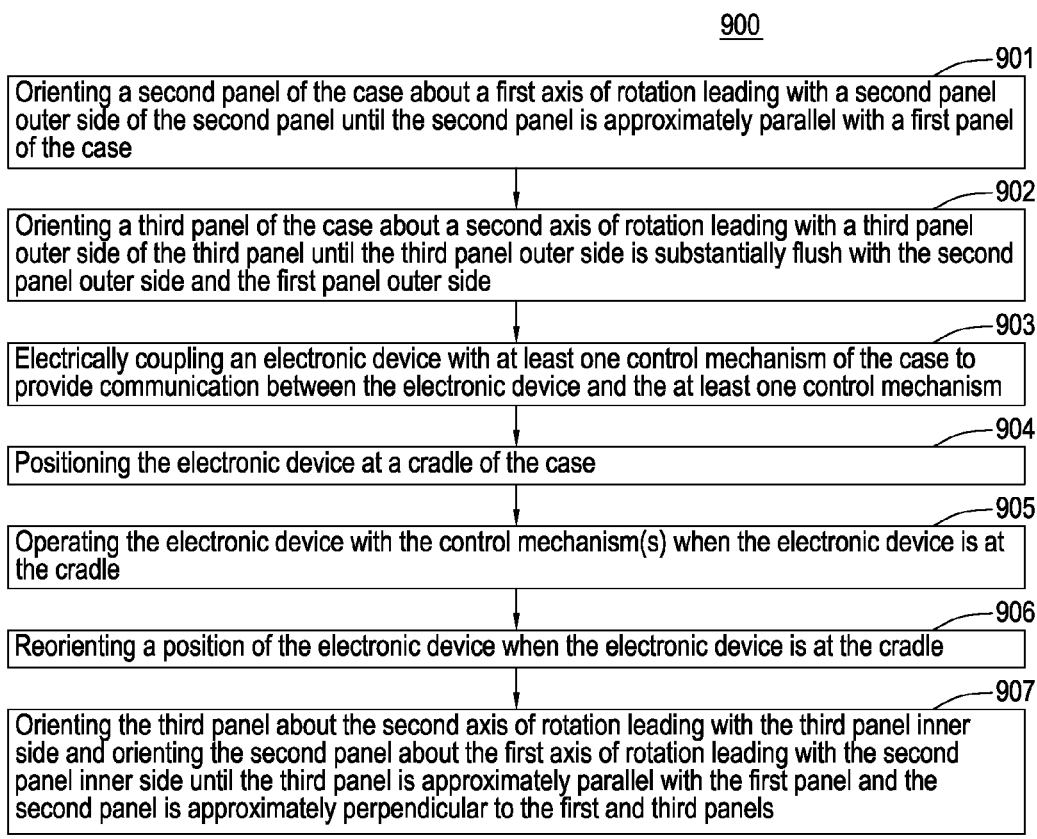
FIG. 9 illustrates a flow chart for an embodiment of a method of using a case for an electronic device.

FIG. 9 illustrates a flow chart for an embodiment of a method 900 of using a case for an electronic device. Method 900 is merely exemplary and is not limited to the embodiments presented herein. Method 900 can be employed in many different embodiments or examples not specifically depicted or described herein. In some embodiments, the procedures, the processes, and/or the activities of method 900 can be performed in the order presented. In other embodiments, the procedures, the processes, and/or the activities of the method 900 can be performed in any other suitable order. In still other embodiments, one or more of the procedures, the processes, and/or the activities in method 900 can be combined or skipped. In many embodiments, the case can be similar or identical to electronic device accessory 100 (FIG. 1), and the electronic device can be similar or identical to electronic device 101 (FIG. 1).

Referring now to FIG. 9, method 900 can comprise procedure 901 of orienting a second panel of the case about a first axis of rotation leading with a second panel outer side of the second panel until the second panel is approximately parallel with a first panel of the case. The second panel can be similar or identical to second panel 103 (FIG. 1), and the second panel outer side can be similar or identical to second panel outer side 109 (FIG. 1). The first panel can be similar or identical to first panel 102 (FIG. 1). The first axis of rotation can be similar or identical to first axis of rotation 117 (FIG. 1).

Method 900 can comprise procedure 902 of orienting a third panel of the case about a second axis of rotation leading with a third panel outer side of the third panel until the third panel outer side is substantially flush with the second panel outer side and the first panel outer side. The third panel can be similar or identical to third panel 104 (FIG. 1), and the third panel outer side can be similar or identical to third panel outer side 113 (FIG. 1). The second axis of rotation can be similar or identical to second axis of rotation 118 (FIG. 1). In some embodiments, procedure 901 and procedure 902 can occur simultaneously with each other.

Method 900 can comprise procedure 903 of electrically coupling an electronic device with at least one control mechanism of the case to provide communication between the electronic device and the at least one control mechanism. The electronic device can be similar or identical to electronic device 101 (FIG. 1), and the control mechanism(s) can be similar or identical to control mechanism(s) 116 (FIG. 1). In some embodiments, procedure 903 can occur before and/or after procedures 901 and 902 occur.

Method 900 can comprise procedure 904 of positioning the electronic device at a cradle of the case. The cradle can be similar or identical to cradle 115 (FIG. 1). In many embodiments, procedures 903 and 904 can occur approximately simultaneously with each other. In other embodiments, procedure 904 can occur before or after procedure 903, or procedure 904 can be omitted.

Method 900 can comprise procedure 905 of operating the electronic device with the control mechanism(s) when the electronic device is at the cradle. In other embodiments of procedure 905, the control mechanisms are used to operate the electronic device while the electronic device is not at the cradle.

Method 900 can comprise procedure 906 of reorienting a position of the electronic device when the electronic device is at the cradle. Reorienting the position of the electronic device can comprise reorienting the electronic device from a portrait position to a landscape position, or vice versa.

Method 900 can comprise procedure 907 of orienting the third panel about the second axis of rotation leading with the third panel inner side, and orienting the second panel about the first axis of rotation leading with the second panel inner side until the third panel is approximately parallel with the first panel and the second panel is approximately perpendicular to the first and third panels.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that procedures 701-716 of FIG. 7, processes 801 and 802 of FIG. 8, and procedures 901-907 of FIG. 9 may be comprised of many different procedures, processes, and activities and be performed by many different modules, in many different orders, that any element of FIGS. 1-11 may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A case for an electronic device, the case comprising:
   a first panel comprising a first panel inner side, a first panel outer side, and a first panel connection side;
   a second panel comprising a second panel inner side, a second panel outer side, a first second panel connection side, and a second second panel connection side;
   a third panel comprising a third panel inner side, a third panel outer side, and a third panel connection side; and
   a cradle coupled to the second panel inner side, the cradle being configured to be coupled with the electronic device in a landscape orientation and in a portrait orientation at different times;
   wherein:
      the first panel inner side comprises at least one control mechanism configured to communicate with and operate the electronic device;
      the first panel connection side is coupled to the first second panel connection side forming a first axis of rotation; and
      the third panel connection side is coupled to the second second panel connection side forming a second axis of rotation.

2. The case of claim 1 wherein:
   the cradle further comprises:
      a first barrier comprising a first barrier device surface, a first barrier outer surface, a first barrier bottom side, and a first barrier top side; and
      a second barrier comprising a second barrier device surface, a second barrier outer surface, a second barrier bottom side, and a second barrier top side;
      wherein:
         the first barrier bottom side is coupled to the second panel inner side;
         the second barrier bottom side is coupled to the second panel inner side;
         the first barrier device surface faces the second barrier device surface; and the first barrier device surface and the second barrier device surface are configured such that when the cradle is coupled with the electronic device, the cradle receives the electronic device between the first barrier device surface and the second barrier device surface.

3. The case of claim 2 wherein:
the cradle further comprises a support mechanism;
the support mechanism comprises a top support mechanism portion and a bottom support mechanism portion;
the top support mechanism portion is coupled to the second barrier outer surface;
the bottom support mechanism portion is coupled to the second panel inner side; and
the support mechanism is configured to provide structural support to the second barrier.

4. The case of claim 2 wherein:
at least the first barrier device surface or the second barrier device surface comprises at least one protection mechanism configured to prevent damage to the electronic device.

5. The case of claim 1 further comprising:
a linking mechanism configured to couple the first panel to the third panel to limit movement of the third panel about the second axis of rotation and to limit movement of the first panel about the first axis of rotation.

6. The case of claim 1 wherein:
at least one of the first panel, the second panel, or the third panel comprises a rigid material.

7. The case of claim 1 wherein:
at least one of the cradle or the second panel inner side comprises a port configured to electrically couple the electronic device to the at least one control mechanism to provide wired communication between the electronic device and the at least one control mechanism.

8. The case of claim 1 further comprising:
a communication module configured to electrically couple the electronic device to the at least one control mechanism to provide direct wireless communication between the electronic device and the at least one control mechanism.

9. The case of claim 1 wherein:
the at least one control mechanism comprises at least one of a keyboard or a touch mouse pad.

10. The case of claim 1 further comprising:
a coupling mechanism coupled to the case and configured to receive a stylus, the stylus being configured to operate the electronic device.

11. The case of claim 1 further comprising:
a fourth panel comprising a fourth panel inner side, a fourth panel outer side, and a fourth panel connection side;
wherein:
the first panel further comprises a second first panel connection side;
the third panel further comprises a second third panel connection side; and
the fourth panel connection side is coupled to one of the second first panel connection side or the second third panel connection side forming a third axis of rotation.

12. The case of claim 11 wherein:
the fourth panel inner side comprises at least one of an ergonomic wrist pad or at least one other control mechanism;
wherein:
the at least one other control mechanism comprising a touch mouse pad or a numeric keypad.

13. The case of claim 1 wherein:
the case is configured such that when the case is positioned in an open configuration and while the cradle is coupled with the electronic device, the third panel outer side faces the first panel outer side and the second panel outer side; and
the case is configured such that when the case is positioned in a closed configuration, the third panel inner side faces the first panel inner side.

14. The case of claim 13 wherein:
when the case is positioned in the closed configuration and when the electronic device is received at the cradle, the electronic device is located between the first panel inner side and third panel inner side; and
when the case is positioned in the open configuration, the first panel outer side and the second panel outer side form a substantially planar surface that is substantially parallel to the third panel outer side.

15. The case of claim 1 wherein at least one of:
the electronic device comprises a mobile electronic device; or the case further comprises a handle coupled to at least one of the first panel or the second panel.

16. A method of providing a case for an electronic device, the method comprising:
providing a first panel comprising a first panel inner side, a first panel outer side, and a first panel connection side;
providing a second panel comprising a second panel inner side, a second panel outer side, a first second panel connection side, and a second second panel connection side;
providing a third panel comprising a third panel inner side, a third panel outer side, and a third panel connection side;
providing a cradle configured to be coupled with the electronic device in a landscape orientation and in a portrait orientation at different times;
providing at least one control mechanism configured to communicate with and operate the electronic device;
coupling the cradle to the second panel inner side;
coupling the at least one control mechanism to the first panel inner side;
coupling the first panel connection side to the first second panel connection side to form a first axis of rotation; and
coupling the third panel connection side to the second second panel connection side to form a second axis of rotation.

17. The method of claim 16 wherein:
providing the cradle further comprises:
providing a first barrier comprising a first barrier device surface, a first barrier outer surface, a first barrier bottom side, and a first barrier top side; and
providing a second barrier comprising a second barrier device surface, a second barrier outer surface, a second barrier bottom side, and a second barrier top side; and
coupling the cradle to the second panel inner side comprises:
coupling the first barrier bottom side to the second panel inner side and coupling the second barrier bottom side to the second panel inner side such that the first barrier device surface faces the second barrier device surface;
wherein:
the first barrier device surface and the second barrier device surface are configured such that when the cradle couples with the electronic device, the cradle receives the electronic device between the first barrier device surface and the second barrier device surface.

18. The method of claim 17 further comprising:
providing a support mechanism comprising a top support mechanism portion and a bottom support mechanism portion;
coupling the top support mechanism portion to the second barrier outer surface; and
coupling the bottom support mechanism portion to the second panel inner side;
wherein:
the support mechanism is configured to provide structural support to the second barrier.

19. The method of claim 16 further comprising:
providing a linking mechanism configured to couple the first panel to the third panel to limit movement of the third panel about the second axis of rotation and to limit movement of the first panel about the first axis of rotation; and
coupling the linking mechanism to at least one of the first panel or the third panel.

20. The method of claim 16 further comprising:
providing at one of the cradle or the second panel inner side a port configured to electrically couple the electronic device to the at least one control mechanism to provide wired communication between the electronic device and the at least one control mechanism.

21. The case of claim 16 further comprising:
providing at the case a communication module configured to electrically couple the electronic device to the at least one control mechanism to provide direct wireless communication between the electronic device and the at least one control mechanism.

22. A method of using a case for an electronic device, the method comprising:
orienting a second panel of the case about a first axis of rotation leading with a second panel outer side of the second panel until the second panel is approximately parallel with a first panel of the case;
orienting a third panel of the case about a second axis of rotation leading with a third panel outer side of the third panel until the third panel outer side is substantially flush with the second panel outer side and a first panel outer side of the first panel; and
electrically coupling an electronic device with at least one control mechanism of the case to provide communication between the electronic device and the at least one control mechanism;
wherein:
the first panel comprises a first panel inner side, a first panel outer side, and a first panel connection side comprising the at least one control mechanism;
the second panel comprises a second panel inner side, the second panel outer side, a first second panel connection side, and a second second panel connection side;
the third panel comprises a third panel inner side, the third panel outer side, and a third panel connection side;
the second panel inner side comprises a cradle configured to be coupled with the electronic device in a landscape orientation and in a portrait orientation at different times;
the first panel connection side is coupled to the first second panel connection side forming the first axis of rotation; and
the third panel connection side is coupled to the second second panel connection side forming the second axis of rotation.

23. The method of claim 22 wherein:
orienting the second panel and orienting the third panel occur simultaneously with each other.

24. The method of claim 22 further comprising:
coupling the electronic device with the cradle in one of the landscape orientation or the portrait orientation; and
reorienting the electronic device to an other one of the landscape orientation or the portrait orientation after coupling the electronic device with the cradle in the one of the landscape orientation or the portrait orientation.

25. The method of claim 24 further comprising:
operating the electronic device when the electronic device is coupled with the cradle.

26. The method of claim 22 further comprising:
orienting the third panel about the second axis of rotation leading with the third panel inner side and orienting the second panel about the first axis of rotation leading with the second panel inner side until the third panel is approximately parallel with the first panel and the second panel is approximately perpendicular to the first and third panels.

27. A case for an electronic device, the case comprising:
a first panel comprising a first panel inner side, a first panel outer side, and a first panel connection side;
a second panel comprising a second panel inner side, a second panel outer side, a first second panel connection side, and a second second panel connection side;
a third panel comprising a third panel inner side, a third panel outer side, and a third panel connection side; and
a cradle configured to be coupled with the electronic device in a landscape orientation and in a portrait orientation at different times;
wherein:
the first panel inner side comprises at least one control mechanism configured to communicate with and operate the electronic device;
the first panel connection side is coupled to the first second panel connection side forming a first axis of rotation;
the third panel connection side is coupled to the second second panel connection side forming a second axis of rotation;
the case is configured such that when the case is positioned in a closed configuration, the third panel inner side faces the first panel inner side; and
when the case is positioned in the closed configuration and when the electronic device is coupled with the cradle, the electronic device is located between the first panel inner side and third panel inner side.

28. The case of claim 27 further comprising:
a communication module configured to electrically couple the electronic device to the at least one control mechanism to provide direct wireless communication between the electronic device and the at least one control mechanism.

29. The case of claim 27 wherein:
the case further comprises a communication module configured to electrically couple the electronic device to the at least one control mechanism to provide wireless communication between the electronic device and the at least one control mechanism, and the at least one control mechanism comprises at least one of a keyboard or a touch mouse pad;
at least one of the first panel, the second panel, or the third panel comprises a rigid material; and
the electronic device comprises a mobile electronic device.

* * * * *